(12) United States Patent
Varma

(10) Patent No.: US 6,462,596 B1
(45) Date of Patent: Oct. 8, 2002

(54) REDUCED-TRANSISTOR, DOUBLE-EDGED-TRIGGERED, STATIC FLIP FLOP

(75) Inventor: Pradeep Varma, New Delhi (IN)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 09/599,900

(22) Filed: Jun. 23, 2000

(51) Int. Cl.[7] .............................................. H03K 3/356
(52) U.S. Cl. ........................ 327/218; 327/210; 327/211
(58) Field of Search .................................. 327/199–201, 327/208–212, 218

(56) References Cited

U.S. PATENT DOCUMENTS

| | | | | |
|---|---|---|---|---|
| 5,081,373 A | * | 1/1992 | Suzuki ........................ | 327/218 |
| 5,179,295 A | * | 1/1993 | Mattison et al. ............ | 327/218 |
| 6,188,636 B1 | * | 2/2001 | Salomon ...................... | 327/212 |
| 6,239,640 B1 | * | 5/2001 | Liao et al. ................... | 327/218 |

* cited by examiner

Primary Examiner—Tuan T. Lam
(74) Attorney, Agent, or Firm—Whitham, Curtis & Christofferson, P.C.; T. Rao Coca

(57) ABSTRACT

A static, double-edge-triggered flip-flop has an upper data path and a lower data path connected between a data input node and an output terminal. The upper path includes a switch connected to a first data loop, and the lower path includes a switch connected to a second data loop. The first and second data loops share a forward path having a data-inverting circuit. In addition, each loop has a feedback path which contains only one element in the form of a switch. However, no data-inverting circuit is included in either of the feedback paths. Advantageously, all the elements of the flip-flop may be constructed using MOSFET transistors implemented according to any one of a variety of semiconductor technologies. In more than one particularly advantageous embodiments, the flip-flop is constructed using a total of twelve transistors. Through this simplified two-loop design, operational efficiency is improved, low metastability is achieved and costs of manufacture are lowered, all while maintaining low power requirements.

9 Claims, 5 Drawing Sheets

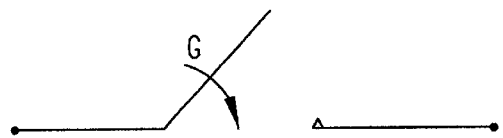
FIG. 7
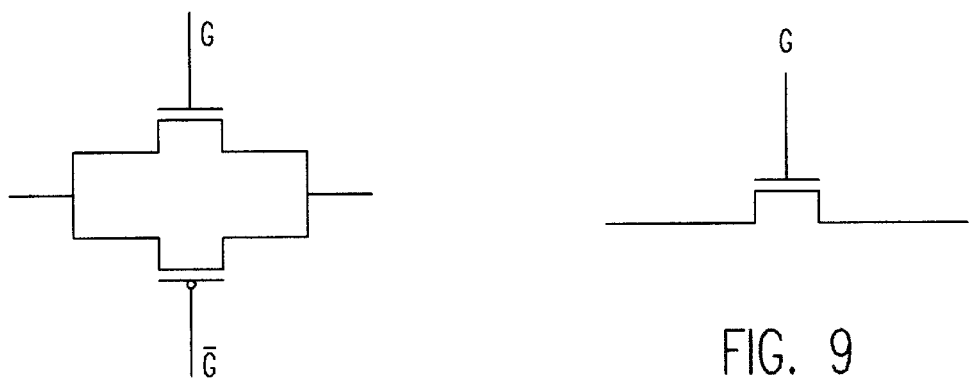
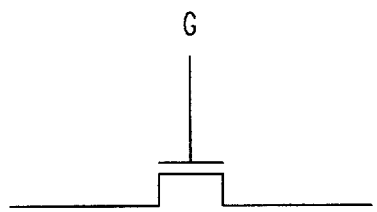
FIG. 9
FIG. 8
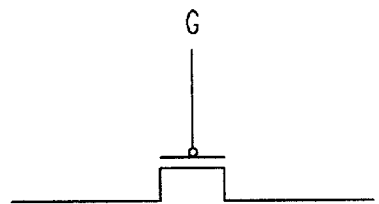
FIG. 10

REDUCED-TRANSISTOR, DOUBLE-EDGED-TRIGGERED, STATIC FLIP FLOP

BACKGROUND OF THE INVENTION

1. Field of the Invention

The present invention generally relates to logic circuits, and more particularly to static flip-flops which trigger on both the rising and falling edges of a clock signal.

2. Background Description

In order to reduce the complexity of circuit design, a large proportion of digital circuits are synchronous circuits; that is, they operate based on a clock signal. Among the more popular synchronous digital circuits are edge-triggered flip-flops. These flip-flops are desirable, especially in digital memories, registers, and caches, because they simplify circuit design, for example, by requiring stability of input data only during short intervals of time.

Edge-triggered flip-flop circuits may be classified into one of two types. The first type latches data on either the rising edge or falling edge of a clock signal. While these so-called single-edge-triggered (SET) flip-flops are in common use today, they are not without drawbacks. From a functional standpoint, they tend to be inefficient. For example, because latching occurs on only one of the rising and falling edges of a clock signal, data flow tends to be slow, i.e., at only one half the clock edge frequency. Also, because of their single clock-edge operation, SET flip-flops incur the power cost of operating at two clock edges per interval while using only one of the edges.

The second type of edge-triggered flip-flop operates on both the rising and falling edges of a clock signal. For a given clock signal, these so-called double-edge-triggered (DET) flip-flops are faster (i.e., operate at higher frequencies) than SET flip-flops, and consume about the same power as the SET flip flops. DET flip-flops are themselves classified into types: dynamic and static. In a dynamic DET flip-flop, latched data is lost if the clock is slowed down below a certain level. On the other hand, in a static DET flip-flop, latched data is retained indefinitely. Thus, static DET flip-flops are preferable for rugged (e.g., variable clock tolerant) digital memory design.

Some DET flip-flops are disclosed in the article by S. H. Unger entitled "Double edge-triggered flip-flops," IEEE Trans. Computer, Vol. C-30, No. 6, pp. 447–451, June 1981. While the flip-flops described in this article are faster compared with some SET flip-flops, their complex design (e.g., a large number of circuit elements) has made it undesirable. In his work, Unger presents DET designs wherein the ones with simplest logic complexity required delay elements which reduce allowable operating speeds. The other designs are between 50% and 100% more complex, in terms of components required, than the corresponding SET circuits. In contrast, the present invention (to be described below) is not based on delay elements. Instead, the present invention uses parallel latching on rising and falling clock edges which cater to maximum operating speeds. Furthermore, the design of the present invention is less complex in terms of components required than all the designs of Unger.

Various attempts have been made to reduce the complexity of DET-type flip flop circuits. See, for example, "A Novel CMOS Implementation of Double-Edge-Triggered Flip-Flops," IEEE Journal of Solid-State Circuits, Vol. 25, No. 4, pages 1008–1010, August 1990, by S. Lu and M. Ercegovac; "Double-Edge-Triggered D-Flip-Flops for High-Speed CMOS Circuits," IEEE Journal of Solid-State Circuits, Vol. 26, No. 8, pages 1168–1170, August 1991, by M. Afghahi and J. Yuan; "Reduced Implementation of D-Type DET Flip-Flops," IEEE Journal of Solid-State Circuits, Vol. 28, No. 3, pages 400–402, March 1993, by Gago et al.; "Low Power Design using Double Edge Triggered Flip-Flops," IEEE Transactions on Very Large Scale Integration (VLSI) Systems, Vol. 2, No. 2, pages 261–265, June 1994, by Hossain et al.; "High-performance two-phase micropipeline building blocks: double-edge-triggered latches and burst-mode select and toggle circuits," IEE Proc.—Circuits Devices Systems, Vol. 143, No. 5, pages 282–288, October 1996, by Yun et al.; and "Low-power double-edge triggered flip flop," Electronics Letters, Vol. 33, No. 10, pages 845–847, May 1997, by Blair. See also U.S. Pat. Nos. 5,179,295, 5,250,858, and 5,793,236.

In this work, Lu et al. present a static DET flip flop design. They present a CMOS implementation that requires 26 MOS transistors with increased complexity vis a vis Unger, whose fast DET D flip flop they characterize as requiring 36 transistors for CMOS implementation with local clock inversion. Lu's design has two loops for maintaining charge levels as a static flip flop that does not depend on the clock period. One loop exists in a high clock enabled latch and the other loop exists in a low clock enabled latch. In an enabled latch's loop, the enablement being decided by the clock, the feedback of data occurs via an inverter. The loops are isolated from each other. There is not sharing of paths among the loops.

Afghahi et al.'s design is for a dynamic DET flip flop. The design is not for a static DET flip flop. The circuits require 20 transistors for a CMOS implementation which does not require an inverted clock.

Yun et al.'s design comprises a psuedo-static version of Afghahi's dynamic design. The design is not that of a static flip flop and requires more transistors than Afghahi's design.

Gago et al. provide a static DET design and a dynamic DET design. They provide an 18 transistor CMOS implementation of the static design in which both Q and Q' terminals are provided (16 transistor, if Q' is not to be provided) and the availability of an inverted clock line is assumed. The design requires two more transistors if the clock is to be inverted locally. The design comprises two latches, each of which has a loop within itself for maintaining charge levels for providing static functionality. The feedback path in each loop is designed to be weak in comparison to the forward path and is based on inverting output data. The loops are isolated from each other except for sharing a common terminal, Q, which is also one of the outputs of the flip flop. There is no shared path among the loops, with distinct input and output nodes for the path.

Hossain et al. provide a static DET design and a dynamic DET design. This includes a 16 transistor CMOS implementation of the static design in which the availability of an inverted clock is assumed. The design requires two more transistors if the clock is to be inverted locally. The design also comprises two latches, each of which has a loop within itself for maintaining charge levels for providing static functionality. The feedback path in each loop includes an inverter and is switched by the clock. The loops are also isolated from each other.

Blair provides a static DET design and a semi-static DET design. The static DET design is a modified version of Hossain's static design, in which the feedback path in the loop within a latch is modified to be an unswitched, permanently ON, weak path. The loops of the latches are isolated from each other. A third loop is formed by feeding back the Q terminal to a Q' terminal using a weak PMOS pull-up transistor. The pull-up transistor acts as a weak inverter when Q is low and in this case, pulls Q' to high. When Q is high, the pull-up transistor is disabled. In order to reduce switching capacitance of the weak inverters in the loops within the latches, Blair describes an implementation of the inverters using "minimum area" transistors in series with permanently ON weak transistors. Using such weak inverters, the number of transistors needed for the static CMOS implementation described is 19. This assumes that an inverted clock is available, without which, the number of transistors is increased by two.

Varma et al. provide a static DET design and a dynamic DET design. This includes a 16 transistor CMOS implementation of the static design in which the availability of an inverted clock is assumed. The design requires two more transistors if the clock is to be inverted locally. The design comprises two latches, each of which has a loop within itself for maintaining charge levels for providing the static functionality. The feedback path in each loop is designed to be weak in comparison to the forward path and is based on inverting output data. The feedback path is partially switched by the clock—the inverter in the feedback is clocked on its way to ground and unswitched on its way to supply. The loops are isolated from each other except for shating a common terminal, Q', which is also one of the outputs of the flip flop. There is no shared path among the loops, with distinct input and output nodes for the path.

U.S. Pat. Nos 4,629,909, 5,179,295, 5,250,858, and 5,793,236 describe designs which are also complex in the sense that no savings via sharing of loops across latches are attempted.

A need exists for a static, DET-type flip flop with a less complex design, and more particularly one which uses fewer elements and thus is more efficient in terms of cost and operating speed compared with conventional DET-type circuits.

SUMMARY OF THE INVENTION

It is a first objective of the present invention to provide a static, double-edge-triggered flip-flop which is faster and more efficient than conventional DET flip-flop circuits.

It is a second objective of the present invention to achieve the first objective through an architecture which requires substantially fewer circuit elements and thus is less complex than conventional flip-flops, all while retaining improved functionality and power requirements compared with single-edge-triggered circuits.

It is another objective of the present invention to provide a double-edge-triggered flip-flop of the aforementioned type using only MOSFET transistors in a variety of semiconductor technologies including NMOS, PMOS, and CMOS.

It is another objective of the present invention to provide a double-edge-triggered flip-flop which has low metastability in comparison to conventional DET flip-flop circuits, wherein low metastability is achieved in -accordance with a design which disables data feedback which can contest input data while the input data is charging/discharging an intermediate, input-latching node. This increases the charging/discharging speed of the node and yields a lower aperture of metastability.

These and other objectives of the invention are achieved by providing a static, double-edge-triggered flip-flop which includes an upper path and a lower path connected between a data input terminal and output terminal. The upper path includes a switch connected to a first data loop, and the lower path has a switch connected to a second data loop.

Each of the data loops is formed from three paths. The first path is a forward path shared by both loops and performs a data inversion function. The loop structure advantageously shifts circuit elements for data inversion from multiple unshared paths (the feedback paths) to a common shared path, thereby reducing the number and cost of circuit elements. The second path is an unshared forward path which performs a data inversion function, and the third path is an unshared feedback path which does not perform a data inversion function. Clocked inverters or equivalent are preferably used to perform the data inversion functions in the unshared forward paths and switches are included in the feedback paths to block out-of-phase data flow from the output terminal to the unshared forward paths. Resistive (i.e., weak) transistors may be used for the feedback switches, to unequivocally decide node conflicts.

Various semiconductor technologies may be used to implement the clocked inverters and switches of the invention. Altering the inverter and switch configurations allow the invention to be configured from differing numbers of transistors. According to one particularly advantageous aspect, the invention may be configured in more than one way in CMOS using a total of twelve transistors, which is substantially fewer than the number of transistors used to construct any of the DET flip-flops conventionally known.

In operation, the upper path passes data to the output terminal in accordance with a clock signal, and the lower path passes data to the output terminal in accordance with a complementary (e.g., inverted) clock signal. Preferably, the clock signal and complementary clock signal are different phases of the same clock. When the existing logical value of data at the output terminal is different from the logical value of data latched at the input of the unshared forward path of an enabled loop, the weak feedback switches operate to block the flow of data from the output terminal, thereby ensuring proper operation.

The present invention thus represents a significant improvement over conventional static, DET flip-flops. The two-loop configuration of the invention simplifies circuit design through its shared forward path and the omission of a data inverter in its feedback paths. The number of transistors used is also significantly less than conventional circuits, and in fact is comparable to the number employed in static, single-edge-triggered flip flops. The invention further may be implemented using only MOSFET transistors that number as few as twelve or fourteen, depending upon the implementation. All of these enhancements enable the invention to realize improved performance in terms of speed, efficiency, and functionality while simultaneously maintaining low cost and power requirements compared with conventional DET flip flops.

BRIEF DESCRIPTION OF THE DRAWINGS

The foregoing and other objects, aspects and advantages will be better understood from the following detailed description of a preferred embodiment of the invention with reference to the drawings, in which:

FIG. 7 is a symbolic diagram of a switch which may be used in the static, double-edge-triggered flip-flop of the present invention;

FIG. 8 is a diagram of a switch, implemented as a transmission gate in CMOS, which may be used in the static, double-edge-triggered flip-flop of the present invention;

FIG. 9 is a diagram of a switch, implemented as a pass transistor in NMOS, which may be used in the static, double-edge-triggered flip-flop of the present invention; and FIG. 10 is a diagram of a switch, implemented as a pass transistor in PMOS, which may be used in the static, double-edge-triggered flip-flop of the present invention.

DETAILED DESCRIPTION OF A PREFERRED EMBODIMENT OF THE INVENTION

Figure 1:
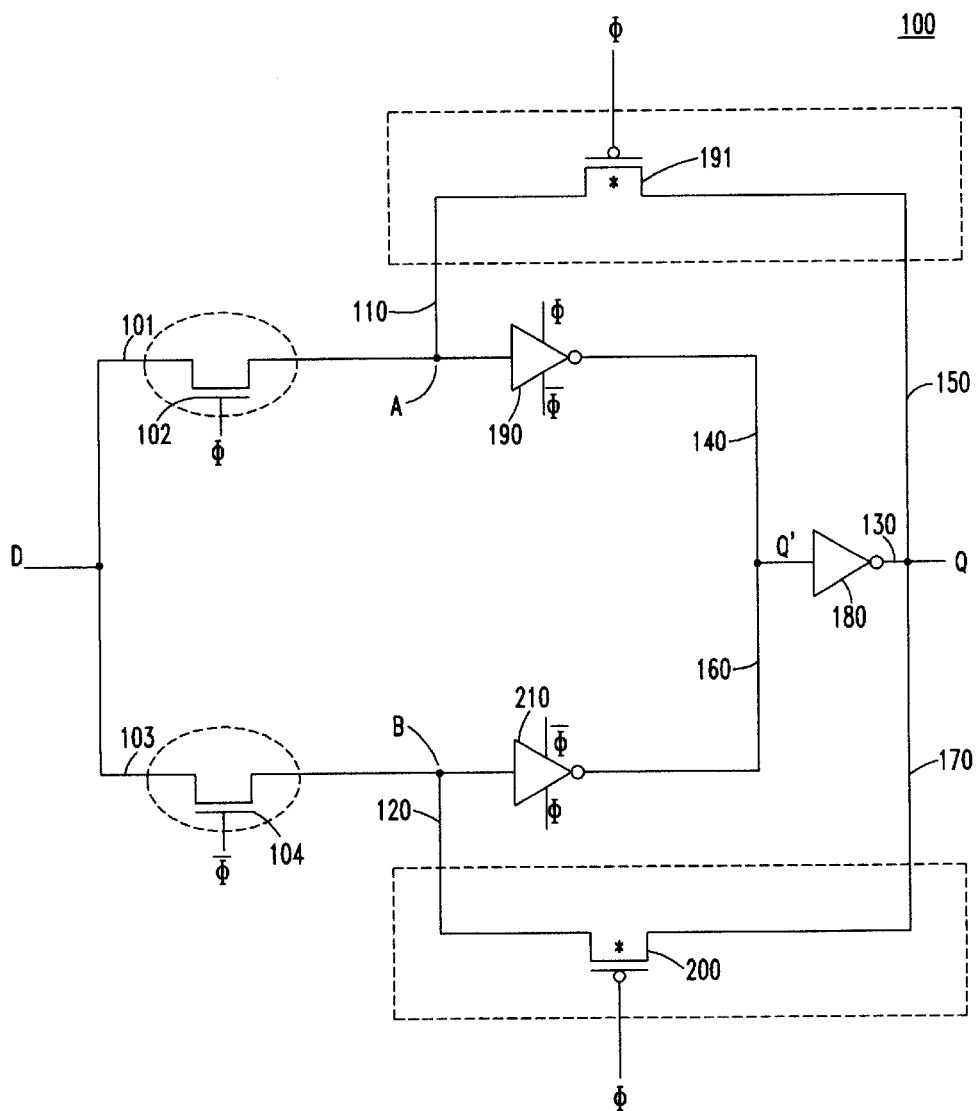
FIG. 1 is a diagram of a design and embodiment of a static, double-edge-triggered flip-flop in accordance with the present invention.

Referring to FIG. 1, a first embodiment of a static, double-edge-triggered flip-flop 100 in accordance with the present invention includes an upper data path and a lower data path connected between a data input node D and an output terminal Q. The upper data path 101 includes a pass transistor 102 connected to a first data loop 110, and the lower data path 103 includes a pass transistor 104 connected to a second data loop 120.

The first and second data loops are each formed from three paths. The first path is a forward path 130 which is shared by both loops and extends between node Q' and node Q. Shared path 130 includes an inverter 180 for performing a data inversion function. As will be explained in greater detail, the upper and lower paths are constructed to operate in accordance with different clock signals, which preferably are non-inverted and inverted clock signals $\phi$ and $\overline{\phi}$. When these signals are derived from the same clock, the flip-flop of present invention advantageously latches data on both the rising and falling edges, thereby effecting maximum efficient data flow between the input and output terminals.

The remaining portions of the first and second loops are unshared paths. For loop 110, the second path 140 extends from node A to node Q' and includes a clocked inverter 190 for performing a data inversion function. The third path 150 is a feedback path which extends from node Q to node A and which includes a single weak (weakness indicated by asterisk) pass transistor 191. For loop 120, the second path 160 extends from node B to node Q' and includes a clocked inverter 210 for performing a data inversion function. The third path 170 is a feedback path which extends from node Q to node B and includes a single weak pass transistor 200. As shown, with the exception of inverter 180, the aforementioned circuit elements operate based on a clock signal and its complement.

Besides showing an embodiment for the invention, FIG. 1 shows the larger design of the invention as follows. The loop structure is as described for the embodiment above, and comprises two data loops with a shared forward path. Note in particular that the feedback paths of the loops comprise a switch alone, and do not require any data inversion. The switches used in our design are circled with dashed boxes or ovals. In the particular embodiment detailed in FIG. 1, each of these switches is implemented using a pass transistor. The choice, however, is optional and other embodiments of the switches are discussed later.

Figure 2:
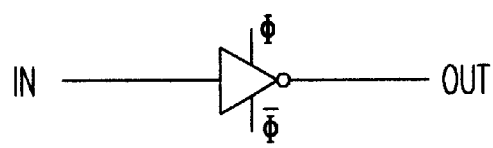
FIG. 2 is a symbolic diagram of a clocked inverter which may be included in the static, double-edge-triggered flip-flop of the present invention.

FIG. 2 is a symbolic diagram of the clocked inverter 190 used in the upper data path of the present invention, and FIGS. 3–6 show exemplary configurations of this clocked inverter implemented in different MOSFET technologies.

Figure 3:
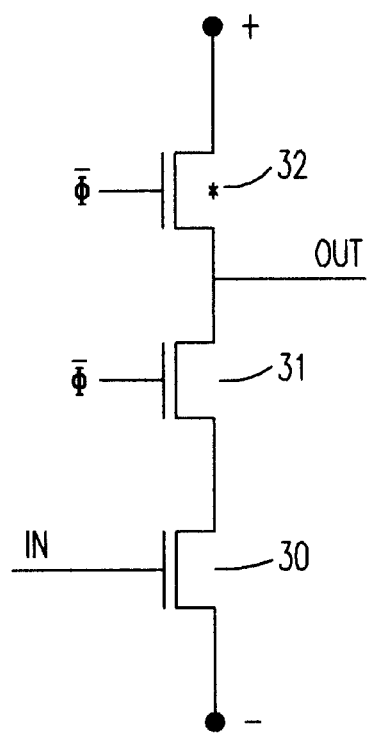
FIG. 3 is diagram of a clocked inverter implemented in NMOS which may be used in the static, double-edge-triggered flip-flop of the present invention.

FIG. 3 shows a clocked inverter implemented in NMOS (supply polarities are as shown), wherein transistor 30 is an input transistor and transistors 31 and 32 operate based on an inverted clock signal.

Figure 4:
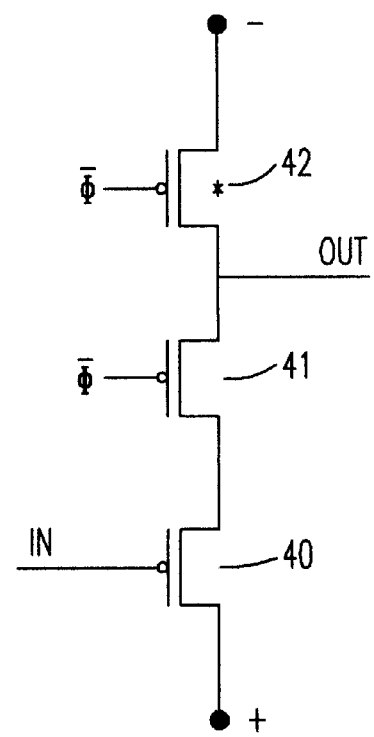
FIG. 4 is diagram of a clocked inverter implemented in PMOS which may be used in the static, double-edge-triggered flip-flop of the present invention.

FIG. 4 shows this element in PMOS (supply polarities are as shown), wherein transistor 40 is an input transistor and transistors 41 and 42 operate based on an inverted clock signal.

Figure 5:
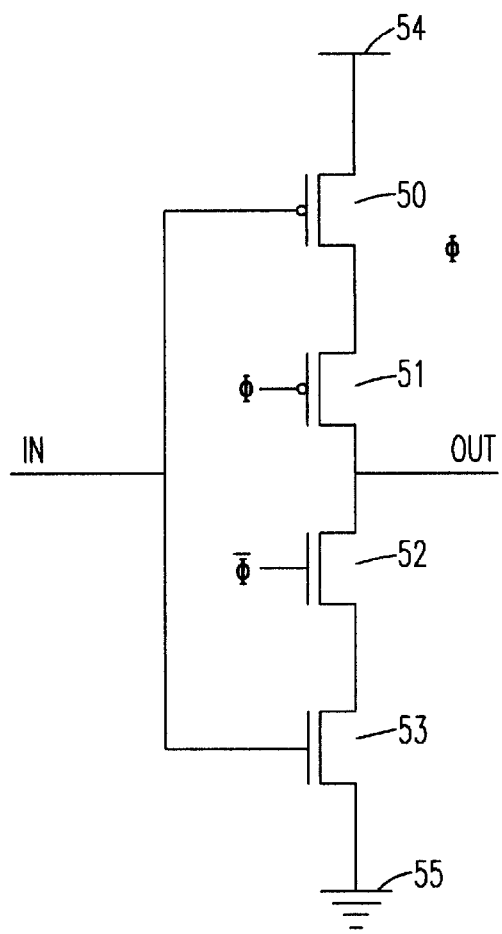
FIG. 5 is diagram of a clocked inverter implemented in CMOS which may be used in the static, double-edge-triggered flip-flop of the present invention.
Figure 6:
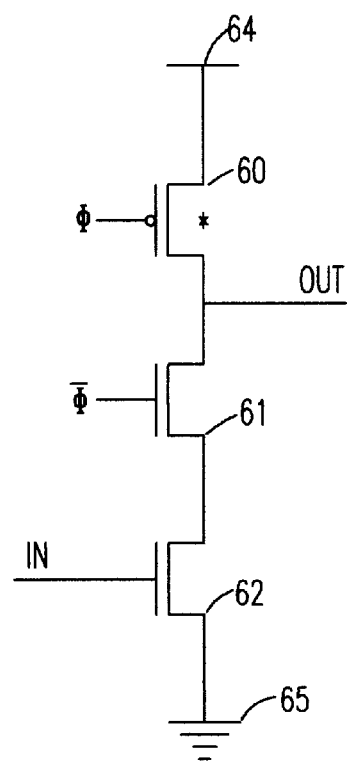
FIG. 6 diagram of a clocked inverter implemented in MOS-style in CMOS which may be used in the static, double-edge-triggered flip-flop of the present invention.

FIG. 5 shows this element in CMOS and FIG. 6 in MOS-style (i.e., in NMOS/PMOS style) in CMOS. In this latter figure, when the inverter is enabled by the clock (i.e., the clock is low), the PMOS transistor between output and supply operates like a load transistor, while the transistors from output to ground operate like driver transistors. This results in a plain MOS style of inverter with a corresponding transfer characteristic. (In these figures, the asterisk (*) is used to identify transistors which are resistive, i.e., weak. Also, as one skilled in the art can appreciate, clocked inverters with a complementary configuration to those shown in FIGS. 2–6, i.e., one which operates based on an inverted clock signal, may be used as element 210 in the lower data path).

A symbolic diagram of a switch of the present invention is shown in FIG. 7. In this diagram, the switch is controlled by a logical input G, which corresponds to a clock signal or inverted clock signal depending upon whether the switch is located in the upper or lower data path of the invention. FIG. 8 shows a standard, transmission gate embodiment of a switch in CMOS technology. FIG. 9 shows a standard, pass transistor embodiment of a switch in NMOS technology. FIG. 10 shows a standard, pass transistor in PMOS technology.

Operation of the flip-flop shown in FIG. 1 will now be described under two separate assumptions. Under the first assumption, feedback paths 150 and 170 are considered to be of infinite resistance regardless of clock, so that these paths are always open.

Taking into consideration data flow from node D to node Q along the upper path (i.e., through path 101), when clock signal $\phi$ is high, switch 102 is closed and the logical value at node D is transferred to node A. When clock signal $\phi$ goes low, switch 102 opens and the voltage at node A just prior to the clock edge becomes the voltage latched at the node. The clocked inverter 190 is enabled in this clock phase (low clock), and the inverse of the latched voltage becomes available at Q'. The inverse of the voltage at node Q' is then output at node Q, which remains constant at node Q during the time that the clock remains low.

With the feedback path open, as assumed above, the circuit operates dynamically, which means that the clock period has to be relatively short for the circuit to work as described. The clock period has to be short in comparison to the RC time constant of the capacitance of node A and the leakage discharge path from node A.

The data flow from node D to node Q along the lower path (i.e., along path 103) is similar to the data flow along the upper path except that opposite clock phases are used to control the circuit elements. Specifically, switch 104 is closed to pass data from node D to node B when the clock signal φ is low, and clocked inverter 210 passes data from node B to node Q' when clock signal φ is high. Thus, the lower path latches data into node B and beyond when the clock signal φ goes high, i.e., on a rising clock edge. Data latched on a falling clock edge in the upper path is output to node Q during the time when clock signal φ is low, and data latched on a rising clock edge in the lower path is output to node Q during the time when clock signal φ is high. If desired, the inverse of data at node Q can be obtained from node Q' in this flip flop.

The operation of the flip-flop in FIG. 1 will now be described with the second assumption, where feedback paths 150 and 170 are of a large, but finite resistance compared to other paths. Specifically, for this example of feedback path 150, as discussed later, the resistance of the feedback path has to be large enough so that the RC time constant of charging node A using the voltage at node Q via the feedback path is greater than the corresponding time constant of charging node Q using the voltage at node A via the forward path. Also, the trivial solution of infinite feedback resistance is not acceptable because the time constant of the feedback path has to be smaller than the time constant of the leakage path from node A in order to have the flip flop operate as a static flip flop and not as a dynamic one. The relative values of the resistances have to be chosen when the clock is in phase and the paths/switches are conducting. For the out-of-phase case, the resistances/paths are open circuited.

Consider the half clock period after a falling clock edge. During this period, the edge latches data at node A, after which a race occurs in the initial part of the half period when the clock signal is low. The (previously) existing voltage at node Q tries to change node A to itself via the feedback path 150 and node A tries to change node Q to itself via the forward path 140 through the clocked inverter 190. If the previously existing voltage at node Q and the voltage latched at node A are the same, then there is no contest between the nodes.

However, if the voltages are at different levels, the race needs to be decided in a manner that yields correct behavior of the circuit. For this purpose, the feedback path is made resistive relative to the forward path (as specified earlier) so that the forward path always wins the race. The same is the case for the feedback path and the forward path in the rising-edge latching, lower portion of the circuit shown in FIG. 1. Note that by catering to the case when initial voltages at A and Q differ by using the solution of resistive feedback, we do not by any means complicate the straightforward case of when the initial voltages of node A and node Q are the same. This case is compatible with the solution of weak feedback path. In other words, the weak feedback path solution is a conservative and safe solution that applies to all voltage level combinations of nodes A and Q. The choice of resistances is fixed when the flip flop is fabricated and refers to the resistances of the conducting transistors.

From the foregoing, it is therefore clear that the flip-flop of FIG. 1 is static because in a clock phase, once the race between an intermediate node A or B and node Q is decided, the intermediate node and node Q reinforce each other via the loop formed through the relevant forward path and feedback path. The logic at the intermediate node and Q can be sustained indefinitely in the case when the clock period is made large, or when the clock stops in any given phase.

The double-edge-triggered flip-flop of the present invention, as shown in FIG. 1, represents a substantial improvement over conventional DET flip-flop circuits. The invention, for example, uses only two data loops which share a forward path. Further, the feedback paths of both loops contain only one switch. Conventional static DET flip-flops, in contrast, have a data inversion circuit in the feedback portions of their data loops. In some conventional designs, this data inversion circuit is connected in series with a switch. In other conventional designs, only an inverter is present in the feedback path and feedback occurs independently of clock phase. In still other conventional circuits, a clocked inverter is included in the feedback path. The presence of a data-inverting circuit in the feedback path is undesirable because it multiplies inversion costs by the number of feedback paths, and increases costs in terms of increased circuit elements and general associated costs such as power and capacitance.

The data loops of the flip-flop of the present invention are configured so that a data-inverting circuit is not needed in the feedback path of either loop. This saving is made by shifting the data inverter from feedback paths to the common shared forward path. Not just this, but our design is able to maintain the unshared parts of the two loops including the feedback paths fully clock switched.

In view of the foregoing features, the present invention is able to achieve a much simpler design compared with conventional static DET flip-flops. As a result, the invention employs fewer circuit elements, costs significantly less, and finds efficiency in terms of speed, power, and fault freeness (metastability reduction). In fact, the sharing and simplicity of the loops of the invention enables equating the overhead of double-edge triggering with the cost of output maintenance during both clock phases in static SET flip flops. The result is that the number of transistors used by the flip flop of the invention is reduced to the same level (twelve transistors) as SET flip flops, a goal that no other static DET flip flop has reached.

Various preferred embodiments of the flip-flop of the present invention will now be discussed. The preferred embodiments have the same basic configuration as in FIG. 1 but differ in respect to the semiconductor technology used to implement one or more of the circuit elements of the invention.

In a first preferred CMOS embodiment, switches 191 and 200 are implemented as feedback pass transistors. As will be explained in greater detail below, switches 191 and 200 make feedback paths 150 and 170 more resistive than other paths when a contest exists between node Q and nodes A or B. Also, in this preferred embodiment, clocked inverters 190 and 210 are MOS-style clocked inverters implemented in accordance with the arrangement shown in FIG. 6.

As shown in FIG. 6, the MOS-style clocked inverter includes three transistors 60, 61, and 62 connected between a power supply 64 and a ground terminal 65, respectively.

The clocked inverter of FIG. 6 works as follows. When the clock, φ, is low, the PMOS transistor 60 and the NMOS transistor 61 conduct. The large resistance of the weak transistor 60 makes it operate like a load transistor and the series combination of transistors 61 and 62 operate like driver transistors. Thus for a low φ, the circuit of FIG. 6 inverts the input in standard MOS inverter manner (for a detailed description of NMOS and PMOS inverters and their characteristics, see the textbook: Herbert Taub, Donald Schilling, "Digital Integrated Electronics," McGraw Hill, 1977). When φ is high, both transistors 60 and 61 are off and the input and output are disconnected. (The inverter of FIG. 6 is shown as operating on a low clock signal and thus is suitable for use as clocked inverter 190 in FIG. 1. Those skilled in the art can appreciate that a complementary configuration may be used for clocked inverter 210 operating on the high value of a clock signal.)

When clocked inverters of the type shown in FIG. 6 are used in the circuit of FIG. 1, only twelve transistors are required to implement the present invention, if inverting the clock is not carried out locally. The twelve transistors are as follows: one each for switches 102, 104, 191, and 200; three each for clocked inverters 190 and 210; and two for plain inverter 180. As those skilled in the art can appreciate, implementing a static, double-edge-triggered flip-flop using only twelve transistors is significantly fewer than the number of transistors used in any conventional static, DET flip-flop, and therefore in at least this respect the invention represents a significant improvement in the art.

In a second preferred embodiment, clocked inverters 190 and 210 are CMOS clocked inverters implemented in accordance with the arrangement shown in FIG. 5. As shown in FIG. 5, the CMOS clocked inverters include four transistors 50, 51, 52, and 53 connected between a power supply 54 and a ground terminal 55, respectively. In FIG. 5, when the clock is low, transistors 51 and 52 are on and the input-to-output relation is that of a standard CMOS inverter (see Taub et al., ibid., for a detailed discussion on a standard CMOS inverter and its transfer characteristic). When the clock is high, transistors 51 and 52 are off and the output is disconnected from the input.

This arrangement in FIG. 5 has one more transistor than the clocked inverter of FIG. 6. Thus, the total number of transistors used to implement the invention of FIG. 1 using the inverter shown in FIG. 5 is fourteen. (The inverter of FIG. 5 is shown as operating on the low phase of a clock signal and thus is suitable for use as clocked inverter 190. Those skilled in the art can appreciate that a complementary configuration may be used for clocked inverter 210 which operates based on the high phase of a clock signal).

In a third preferred embodiment, pass transistors 102 and 104 are replaced by the transmission-gate implementation of a CMOS switch shown in FIG. 8. The transistor count of the third preferred embodiment is therefore fourteen, assuming clocked-inverter implementation based on FIG. 6.

In a fourth preferred embodiment, clocked inverters 190 and 210 are implemented in accordance with the arrangement shown in FIG. 5 and pass transistors 102 and 104 are implemented based on the transmission-gate configuration of a CMOS switch shown in FIG. 8. As a result, this preferred embodiment has a total of sixteen transistors. (It is noted that none of the transistor counts described above include the cost of inverting a clock, if it turns out that an inverted clock is not available. In this case, a cost of two transistors has to be incurred, for inverting the clock locally.)

In the foregoing embodiments, the weak transistors may be formed by increasing their channel lengths in comparison to their channel widths. This can result in an increase in the gate areas of the transistors, with a resulting increase in their switching capacitances. By taking steps to reduce the switching capacitance of the resulting transistor, a weak pass transistor may be formed by a series combination of a standard transistor and an unswitched (permanently on) transistor of desired weakness.

Figure 11:
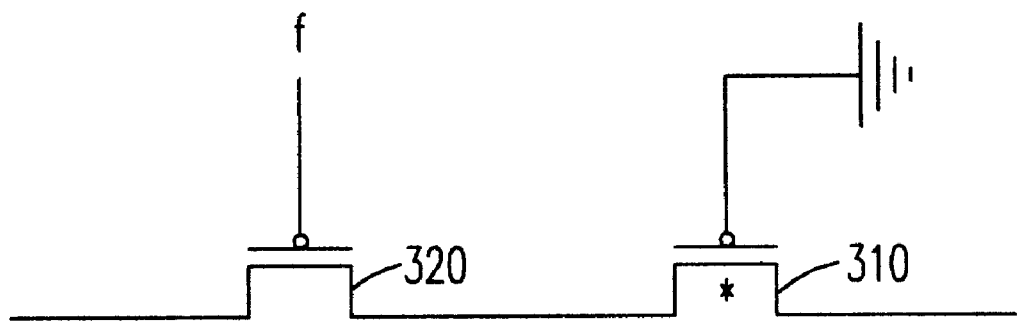
FIG. 11 is a diagram of a weak switch implemented using a series combination of pass transistors such that the load offered to the switching signal, $\phi$, is that of a standard transistor.

FIG. 11 shows an example of a weak PMOS pass transistor implemented using a series combination of PMOS pass transistors. One of the pass transistors 310 is permanently on by connecting the gate of the transistor to ground. The other transistor 320 has its gate connected to clock signal f, thus the transistor is not always on but rather is switched by f. The switched transistor is made of a standard size, so the capacitive load offered is the standard load. The unswitched transistor can have a non-standard size, that depends on the channel length and width chosen for the transistor to meet its weakness requirements. The non-standard capacitance,-however, is connected to a fixed signal (ground), so that the switching load offered by the capacitance is zero.

Fifth through eighth preferred embodiments of the present invention are the same as the first through fourth preferred embodiments, respectively, except that each weak feedback transistor 191 and 200 is replaced by a series combination of two pass transistors to implement the weak transistor. The combination of FIG. 11 can substitute for feedback transistor 191. Similarly, by changing the switching signal in FIG. 11 to be the complement of f, the combination can be used in place of feedback transistor 200.

With this arrangement, the transistor counts for the fifth through eighth embodiments are two more than the counts for the first through fourth preferred embodiments, respectively, with the maximum count being eighteen.

Additional embodiments of the invention are possible within the combinations described above. For example, one of pass transistors 102 and 104 may be replaced with a transmission gate as shown in FIG. 8.

Additional preferred embodiments of the invention are as follows. The clocked inverter 190 can be replaced with the equivalent circuit of FIG. 12 and a similar replacement can be done for clocked inverter 210 also (wherein the switching signal used is f instead of the complement of f shown in FIG. 12). The use of FIG. 12 for a clocked inverter provides a low transistor count, indeed, the same as the clocked inverter of FIG. 6. However, in comparison to FIG. 6, the circuit of FIG. 12 suffers from a threshold voltage drop, a $V_T$ drop, for the logic 1 voltage. Such a drop may not be desirable for the Q' node/terminal of the flip flop.

Figure 12:
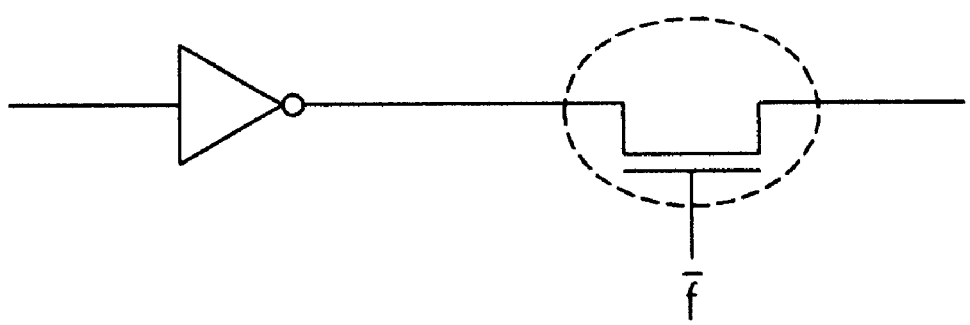
FIG. 12 is a diagram of a clocked inverter equivalent circuit.

Also, as discussed in a later context, such a drop has power loss implications for CMOS switches driven by the signal, as for instance in the ensuing inverter 180. The $V_T$ drop of FIG. 12 can be eliminated by substituting for the switch shown in the dashed oval by, for example, a transmission gate (FIG. 8). This choice then increases the number of transistors needed for the purpose. In any case, FIG. 12 provides a scope for additional preferred embodiments that are within the scope of this invention.

Also, feedback transistor switches 191 and 200 may be replaced with weak transmission gates implemented, for example, using a series combination of pass transistors or transmission gates.

Next, properties are described which may be of guidance in the actual implementation of the preferred embodiments described above.

The first preferred embodiment, as explained, uses a MOS-style in CMOS clocked inverter with a decision-making capability biased towards a low voltage. This is the result of the plain MOS-style, e.g., contrast the transition regions of a typical, plain NMOS inverter and a typical, plain CMOS inverter. The NMOS inverter makes a transition soon after the input voltage rises above a threshold voltage, $V_T$, while the transition of the CMOS inverter is more or less centered between the logical 1 voltage and the logical 0 voltage. This can result in the decision-making in NMOS being closer to logical 0 voltage than logical 1 voltage.

For example, in a typical CMOS setting with logical 1 being 5 Volts, logical 0 being ground, and VT being about 1 Volt, use of the MOS-style inverter biases decision making towards lower voltages. Since the input from node D goes through an NMOS pass transistor before reaching a clocked inverter in the first preferred embodiment, the input itself undergoes a $V_T$ drop in voltage if the input is logical 1. Thus, the range of voltage seen at nodes A and B, if the feedback paths are open-circuited for a moment, is not the full 0 to 5 Volts range but rather is a lower range of about 0 to 4 Volts. Since this range itself is somewhat biased towards logical 0 voltage, having a decision maker biased towards logical 0, for the clocked inverter of the FIG. 2 embodiment is beneficial.

Using a CMOS inverter has a further benefit in-(virtually) not consuming any static power when its input is at either logical voltage extreme, i.e., logical 0 or logical 1. For intermediate voltages, however, the CMOS inverter can have both its NMOS and PMOS transistors partially on, resulting in significant power consumption. Continuing with the assumption that the feedback paths are open, the logic 1 voltage input for the clocked CMOS inverter is an intermediate voltage that can result in a relatively high consumption of power, if the clocked inverter is a typical CMOS clocked inverter, as in the embodiment of FIG. 5. However, if the clocked inverter is in MOS style, as in FIG. 6, the inverter does not suffer extra losses on account of its input being at an intermediate voltage. On the other hand, a MOS-style clocked inverter causes a static power drain when an enabled clocked inverter drives an output voltage of 0. This can be viewed as a static price paid for high bits (at nodes D and Q) when the clocked inverter is configured as in FIG. 6.

Dropping now the open circuit assumption, consider the effect of the feedback paths in FIG. 1 when the pass transistors/switches 191 and 200 are as shown. The PMOS pass transistor in a feedback path does not cause a threshold voltage drop ($V_T$ drop) from logical 1. This has an effect of pulling up a $V_T$ drop in an initially latched voltage as a result of the feedback. This is beneficial because it ameliorates the power consumption of a standard CMOS-style clocked inverter embodiment as taken from FIG. 5. On the other hand, if NMOS pass transistors are substituted for PMOS transistors in the feedback paths of FIG. 1, the feedback does not have an effect on the $V_T$ drop and no amelioration in power loss as described above takes place.

From a power perspective, the choice between the clocked inverter of FIGS. 5 and 6 may be based on the typical operating frequency chosen for the flip-flop and the kind of data handled by the flip flop. The choice between a series implementation of a weak feedback pass transistor and a single weak pass transistor may be made based on the actual gate area required for the single transistor case. The use of a PMOS transistor for feedback places the lower mobility of PMOS carriers in the service of increasing the resistance of the transistor as desired. Switching to a series implementation may not be desirable if the clock and inverse clock lines can support the capacitance of single weak transistors, or if the capacitance of single transistors is not significant.

The flip-flop of the present invention is advantageous in a number of other respects. For example, the flip-flop of the invention is oriented towards low metastability because the feedback paths in the design are clocked. For an asynchronous input, metastability would manifest itself primarily because of an inadequate charging or discharging of an intermediate node, A or B, when an input data edge overlaps with a clock edge. Since the nodes are isolated from the clocked inverter and the feedback switch during the time that the nodes are being charged or discharged by the input, the nodes present little load to the input for the purpose of charging or discharging. This is beneficial in terms of reducing the aperture of time in which the nodes can be charged or discharged, which in turn reduces the metastability of the circuit.

Alternative embodiments of the flip-flop of the present invention may be implemented using solely NMOS and PMOS transistors. If only NMOS transistors are used, the clocked inverters would be implemented in accordance with the arrangement shown in FIG. 3 and the pass transistors in accordance with the arrangement shown in FIG. 9. If only PMOS transistors are used, the clocked inverters would be implemented in accordance with the arrangement shown in FIG. 4 and the pass transistors in accordance with the arrangement shown in FIG. 10. (As those skilled in the art can appreciate, in the purely NMOS and PMOS embodiments of the invention, the clocked inverters of FIGS. 5 and 6 and the pass transistor of FIG. 8 cannot be used directly since they have both NMOS and PMOS components). Aside from these differences, however, the circuits and design disclosed herein can be used directly.

As a further advantage, a low-power implementation of the invention may be achieved wherein the effect on power of threshold voltage drop due to pass transistors is limited to only two pass transistors connected to the input, and power consumption may be determined by data input such as the number of high (1) bits in the input, and the frequency of operation. While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A static, double-edge triggered flip-flop comprising:
   an input terminal;
   an output terminal;
   a first switch passing data from the input terminal to a first intermediate node on a clock signal;
   a first data loop connected between said first intermediate node and said output terminal, wherein said fist data loop includes:
   (a) a first forward path having a clocked inverter which operates based on a complementary clock signal;
   (b) a shared path connected to an output of said first forward pat; and
   (c) a first feedback path connected from an output of said shared path to an input of said first forward path; and
   a second switch passing data from the input terminal to a second intermediate node on said complementary clock signal
   second data loop connected between said second intermediate node and said output terminal, wherein said second data loop includes:
   (a) a second forward pat having a clocked inverter which operates based on said clock signal;
   (b) said shared path connected to an output of said second forward pat; and
   (c) a second feedback path connected from an output of said shared path to an input of said second forward path,
      wherein said shared path of said first and second data loops includes an inverter for inverting data output from the clocked inverters in said first and second for paths.

2. The flip-flop of claim 1, wherein said clock signal and said complementary clock signal are different phases of a same clock signal output from a single clock circuit.

3. The flip-flop of claim 1, wherein said first switch operates on said clock signal and the clocked inverter in said first forward path of said first data loop operates on said complementary clock signal, and wherein said second switch operates on said complementary clock signal and the clocked inverter in said second forward path of said second data loop operates on said clock signal.

4. The flip-flop of claim 1, wherein said first feedback path includes a first feedback switch for controlling data flow from the output terminal to said first forward path, and wherein said second feedback path includes a second feedback switch for controlling data flow from the output terminal to said second forward path.

5. The flip-flop of claim 1, wherein said first switch, said second switch, the clocked inverters in said first and second forward paths, said first feedback switch, said second feedback switch, and the inverter in said shared path are implemented using only MOSFETs.

6. The flip-flop of claim 1, wherein said first switch, said second switch, the clocked inverters in said first and second forward paths, said first feedback switch, said second feedback switch, and the inverter in said shared path are implemented using CMOS technology so that one of twelve or fourteen total MOSFETs are used.

7. The flip-flop of claim 1, wherein said first switch, said second switch, the clocked inverters in said first and second forward paths, said first feedback switch, said second feedback switch, and the inverter in said shared path are implemented using MOS style in CMOS technology.

8. The flip-flop of claim 1, wherein said first switch, said second switch, the clocked inverters in said first and second forward paths, said first feedback switch, said second feedback switch, and the inverter in said shared path are implemented using only NMOS transistors so that one of twelve or fourteen total MOSFETs are used.

9. The flop-flop of claim 1, wherein said first switch, said second switch, the clocked inverters in said first and second forward paths, said first feedback switch, said second feedback switch, and the inverter in said shared path are implemented using only PMOS transistors so that one of twelve or fourteen total MOSFETs are used.

* * * * *